United States Patent
Kishimoto

(10) Patent No.: US 11,264,571 B2
(45) Date of Patent: Mar. 1, 2022

(54) BAKE SYSTEM AND METHOD OF FABRICATING DISPLAY DEVICE USING THE SAME

(71) Applicant: Samsung Display Co., Ltd., Yongin-Si (KR)

(72) Inventor: Katsushi Kishimoto, Seoul (KR)

(73) Assignee: Samsung Display Co., Ltd.

( * ) Notice: Subject to any disclaimer, the term of this patent is extended or adjusted under 35 U.S.C. 154(b) by 129 days.

(21) Appl. No.: 16/656,462

(22) Filed: Oct. 17, 2019

(65) Prior Publication Data

US 2020/0152879 A1 May 14, 2020

(30) Foreign Application Priority Data

Nov. 9, 2018 (KR) .................. 10-2018-0137442
Jun. 4, 2019 (KR) .................. 10-2019-0065966

(51) Int. Cl.
*H01L 51/00* (2006.01)
*H01L 51/56* (2006.01)

(52) U.S. Cl.
CPC .......... *H01L 51/0026* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 2002/0127340 A1* | 9/2002 | Kitano | H01L 21/67253 427/294 |
| 2006/0278954 A1* | 12/2006 | Izumi | H01L 27/11502 257/532 |
| 2010/0294024 A1* | 11/2010 | Kumar | B82Y 30/00 73/38 |

(Continued)

FOREIGN PATENT DOCUMENTS

| | | |
|---|---|---|
| CN | 106981586 A | 7/2017 |
| JP | 2005-093700 A | 4/2005 |

(Continued)

OTHER PUBLICATIONS

M. S. Weaver,a) L. A. Michalski, K. Rajan, M. A. Rothman, J. A. Silvernail, and J. J. at Brown Universal Display Corporation, P. E. Burrows, G. L. Graff, M. E. Gross, P. M. Martin, M. Hall, E. Mast, C. Bonham, W. Bennett, and M. Zumhoff at Pacific Northwest National Laboratory, "Organic light-emitting devices with extended operating lifetimes on plastic substrates", Applied Physics Letters, vol. 81, No. 16, Oct. 14, 2002, 2928-2931 (4 pages), © 2002 American Institute of Physics.

*Primary Examiner* — Ali Naraghi
(74) *Attorney, Agent, or Firm* — Innovation Counsel LLP

(57) ABSTRACT

A bake system may include a chamber having an internal space, a stage disposed in the internal space of the chamber and on which a target substrate is disposed, a gas ejection structure providing a process gas in the chamber, an exhaust structure, an atmosphere analyzer monitoring moisture and oxygen in the chamber, and a gas supplier controlling a flow (Continued)

rate of the process gas based on information provided from the atmosphere analyzer. The exhaust structure may include a suction part disposed in the internal space, and an exhaust part connected to the suction part and is disposed outside the chamber.

13 Claims, 13 Drawing Sheets

(56) References Cited

U.S. PATENT DOCUMENTS

| | | | |
|---|---|---|---|
| 2013/0207785 A1* | 8/2013 | Lin | G06K 19/0717 340/10.42 |
| 2014/0105242 A1* | 4/2014 | Fernandes | G01K 7/16 374/45 |
| 2016/0016423 A1* | 1/2016 | Mauck | B41J 29/06 347/110 |

FOREIGN PATENT DOCUMENTS

| | | |
|---|---|---|
| KR | 10-2017-0087102 A | 7/2017 |
| KR | 10-2018-0133007 A | 12/2018 |

* cited by examiner

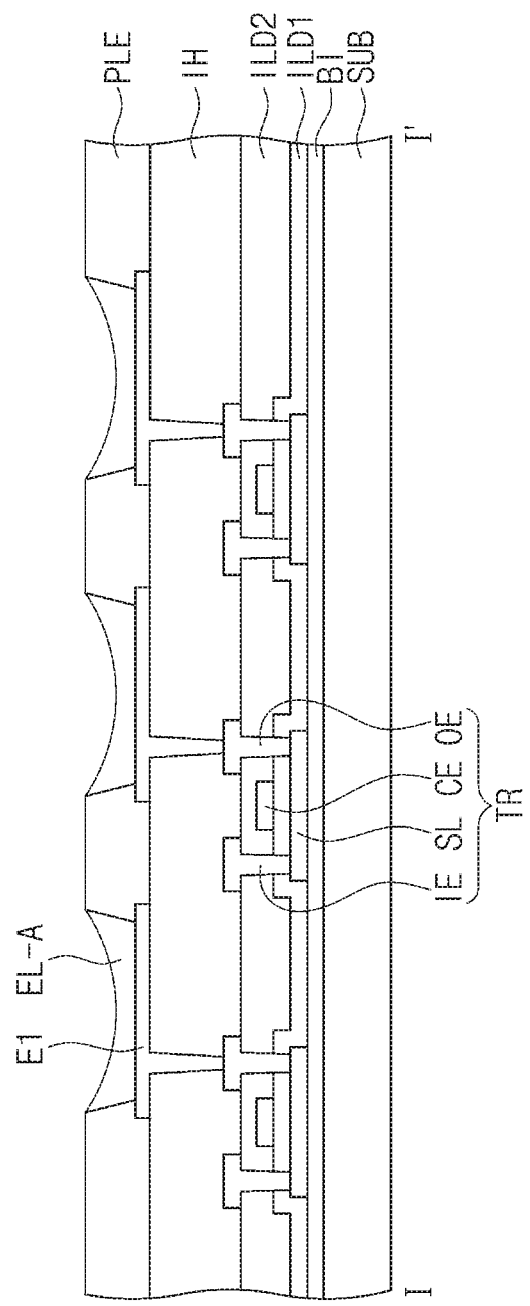

FIG. 6
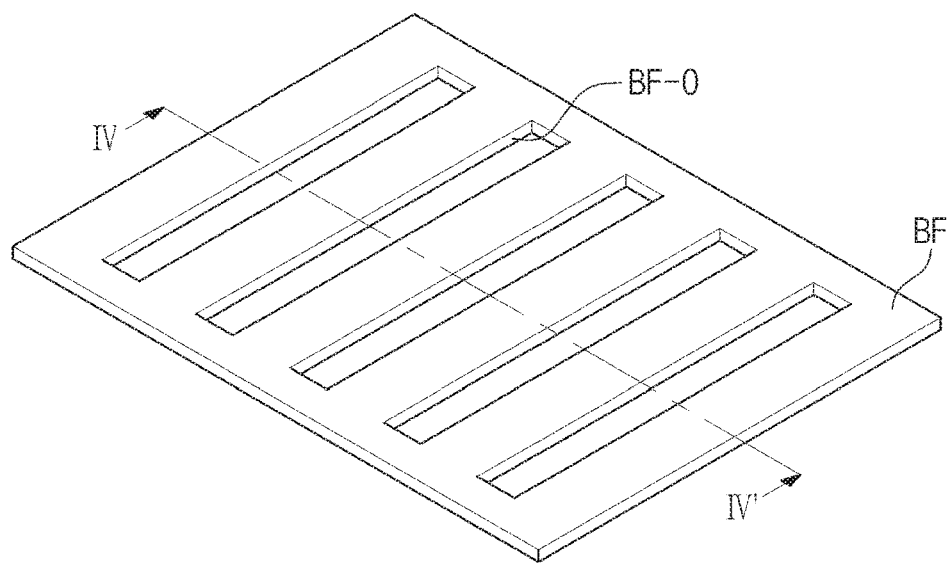
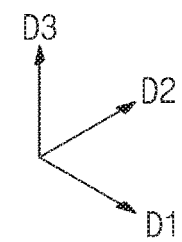
FIG. 7
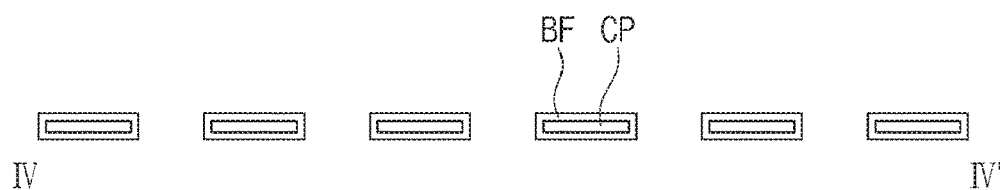
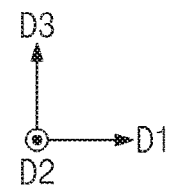

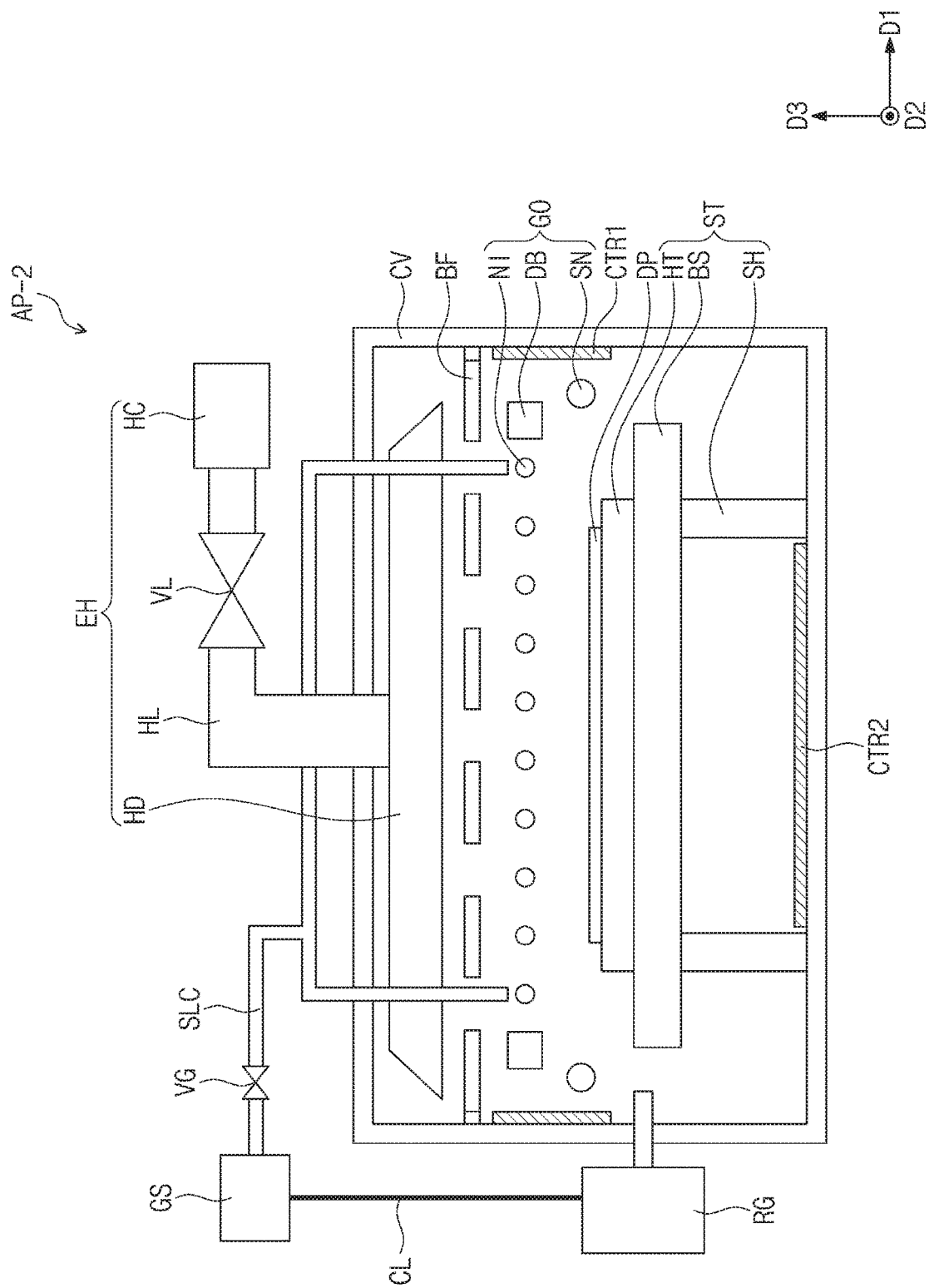

BAKE SYSTEM AND METHOD OF FABRICATING DISPLAY DEVICE USING THE SAME

CROSS-REFERENCE TO RELATED APPLICATIONS

This U.S. non-provisional patent application claims priority under 35 U.S.C. § 119 to Korean Patent Application Nos. 10-2018-0137442, filed on Nov. 9, 2018 and 10-2019-0065966, filed on Jun. 4, 2019, in the Korean Intellectual Property Office, the disclosures of which are hereby incorporated by reference in their entirety.

BACKGROUND OF THE INVENTION

The present disclosure relates to a bake system and a method of fabricating a light-emitting display device using the same, and in particular, to a highly reliable bake system and a method of fabricating a light-emitting display device using the same.

An organic light emitting display device that is one of self-luminescent display devices. Due to its technical advantages, such as wide viewing angle, good contrast, and fast response speed, the organic light emitting display device is emerging as a next-generation display device.

The organic light emitting display device includes an anode electrode, a cathode electrode, and a light emitting layer that is disposed between the anode and cathode electrodes. The light emitting layer is formed of an organic light emitting material. In the case where positive and negative voltages are respectively applied to the anode and cathode electrodes, holes injected from the anode electrode move into the light emitting layer through a hole injection layer and a hole transport layer, and electrons from the cathode electrode move into the light emitting layer through an electron injection layer and an electron transport layer. In the light emitting layer, the electrons are recombined with the holes to produce excitons. When the excitons make a transition to an excited state from a ground state, light is emitted from the light emitting layer.

Here, the hole injection layer, the hole transport layer, and the light emitting layer are formed by ejecting an organic solution that contains an organic material onto a target substrate using a solution coating method, such as an inkjet printing method or a nozzle printing method, and drying the organic solution thereafter.

SUMMARY

Oxygen, moisture, and impurity may exist in a bake system and a target substrate, on which an organic solution is ejected. In a case where, during a process of forming a thin film of a light-emitting display device, oxygen, moisture, and impurity may come in contact with the organic solution of the target substrate, negatively affecting film characteristics of an organic layer. This may lead to deterioration in quality and a life span of the light-emitting display device.

An embodiment of the inventive concept provides a bake system that is configured to control oxygen, moisture, and impurity in a chamber during the process of forming a thin film of a light-emitting display device and thereby providing a controlled process environment suitable for forming the thin film. Furthermore, an embodiment of the inventive concept provides a bake system that can improve quality and a life span of a light-emitting display device, and a method of fabricating the light-emitting display device using the same.

According to an embodiment of the inventive concept, a bake system may include a chamber having an internal space, a stage disposed in the internal space of the chamber and on which a target substrate is disposed, a gas ejection structure providing a process gas in the chamber, an exhaust structure including a suction part disposed in the internal space, and an exhaust part connected to the suction part and is disposed outside the chamber, an atmosphere analyzer monitoring moisture and oxygen in the chamber, and a gas supplier controlling a flow rate of the process gas, based on information provided from the atmosphere analyzer.

In an embodiment, the bake system may further include a guide part disposed between the suction part and the gas ejection structure. The guide part may include one or more openings, and the process gas may be exhausted to the exhaust structure through the one or more openings of the guide part.

In an embodiment, the bake system may further include a cooling part disposed in the guide part and configured to decrease the temperature of the internal space of the chamber.

In an embodiment, the gas ejection structure may include a first ejection structure and a second ejection structure that is spaced apart from the first ejection structure and configured to produce an airflow in a direction different from that produced by the first ejection structure.

In an embodiment, the first ejection structure may include a first transfer pipe connected to the gas supplier, a first distribution pipe connected to the first transfer pipe, and a first ejection pipe connected to the first distribution pipe. The first ejection pipe may include a first ejection hole configured to eject the process gas.

In an embodiment, the first ejection pipe may include a first ejection hole and a second ejection hole configured to eject the process gas in different directions.

In an embodiment, the second ejection structure may include a second transfer pipe connected to the gas supplier, a second distribution pipe connected to the second transfer pipe, and a second ejection pipe connected to the second distribution pipe. The second ejection pipe may include a second ejection hole configured to eject the process gas.

In an embodiment, the gas ejection structure may further include a dummy part disposed between the first ejection structure and the second ejection structure and is extended along the second ejection pipe. The process gas ejected through the second ejection pipe may be deflected by the dummy part and may be exhausted to the exhaust structure.

In an embodiment, the stage may further include a heating part providing heat to the target substrate.

In an embodiment, the stage may include a loading part configured to load the target substrate into the chamber, and a supporting part connected to the loading part. A height of the loading part may be controlled by the supporting part.

In an embodiment, the exhaust structure may further include an exhaust control part connected to the exhaust part and configured to control an exhaust amount of the process gas.

In an embodiment, the target substrate may include a base substrate, a transistor disposed on the base substrate, a first electrode connected to the transistor, a pixel definition layer including an opening exposing at least a portion of the first electrode, and a preliminary organic layer filling the opening.

In an embodiment, the chamber may further include at least one cooling part disposed in an inner wall of the chamber and configured to remove an organic solution in the chamber.

According to an embodiment of the inventive concept, a bake system may include a first apparatus, a second apparatus, and a connecting portion. The first apparatus may include a first chamber having a first internal space, a first stage disposed in the first internal space of the first chamber and configured to provide heat and to load a target substrate thereon, and a cooling part spaced apart from the first stage. The second apparatus may include a second chamber having a second internal space, a second stage disposed in the second internal space of the second chamber, a gas ejection structure providing a process gas into the second chamber, an atmosphere analyzer monitoring moisture and oxygen in the second chamber, and a gas supplier controlling a flow rate of the process gas, based on information provided from the atmosphere analyzer. The connecting portion may be connected to each of the first apparatus and the second apparatus and may be configured to provide a passageway for loading or unloading the target substrate.

In an embodiment, the first apparatus may include a pump connected to the first chamber and disposed outside the first chamber. The pump may be used to exhaust moisture and oxygen escaped from the target substrate.

In an embodiment, the second apparatus may include an exhaust structure including a suction part that is disposed in the second chamber, and an exhaust part disposed outside the second chamber and connected to the suction part.

In an embodiment, the bake system may further include a guide part disposed between the suction part and the gas ejection structure. The guide part may include one or more openings, and the process gas may be exhausted to the exhaust structure through the one or more openings.

In an embodiment, the gas ejection structure may include a first ejection structure and a second ejection structure that is spaced apart from the first ejection structure and configured to produce an airflow in a direction different from that produced by the first ejection structure.

According to an embodiment of the inventive concept, a method of fabricating a display device may include providing a target substrate including an organic solution on a stage of a chamber, providing a process gas into an internal space of the chamber, monitoring oxygen and moisture in the internal space of the chamber, and removing an organic solvent included in the organic solution by ejecting the process gas onto the target substrate thereby forming an organic layer on the target substrate. A flow rate of the process gas is controlled based on amounts of the oxygen and the moisture monitored in the internal space of the chamber.

In an embodiment, the method may further include removing the moisture and the oxygen included in the target substrate.

In an embodiment, the method may further include removing the moisture and the oxygen from the internal space of the chamber, after the forming of the organic layer.

In an embodiment, the process gas may include a material capable of removing the moisture and the oxygen escaped from the chamber and the target substrate.

In an embodiment, a concentration of the moisture in the chamber may be lower than 0.03 ppm.

In an embodiment, the chamber may further include a cooling part disposed in the internal space of the chamber.

In an embodiment, the method may further include removing the organic solution evaporating from the target substrate, using the cooling part.

BRIEF DESCRIPTION OF THE DRAWINGS

Example embodiments of the inventive concept will be more clearly understood from the following brief description taken in conjunction with the accompanying drawings. The accompanying drawings represent non-limiting, the example embodiments as described herein.

FIG. 3 is a sectional view taken along a line I-I' of FIG. 2.

FIGS. 5B and 5C are sectional views illustrating a component of a bake system according to an embodiment of the inventive concept.

FIG. 6 is a perspective view illustrating a component of a bake system according to an embodiment of the inventive concept.

FIG. 7 is a sectional view taken along a line IV-IV' of FIG. 6.

FIG. 11 is a sectional view schematically illustrating a bake system, according to an embodiment of the inventive concept.

Figure 1:
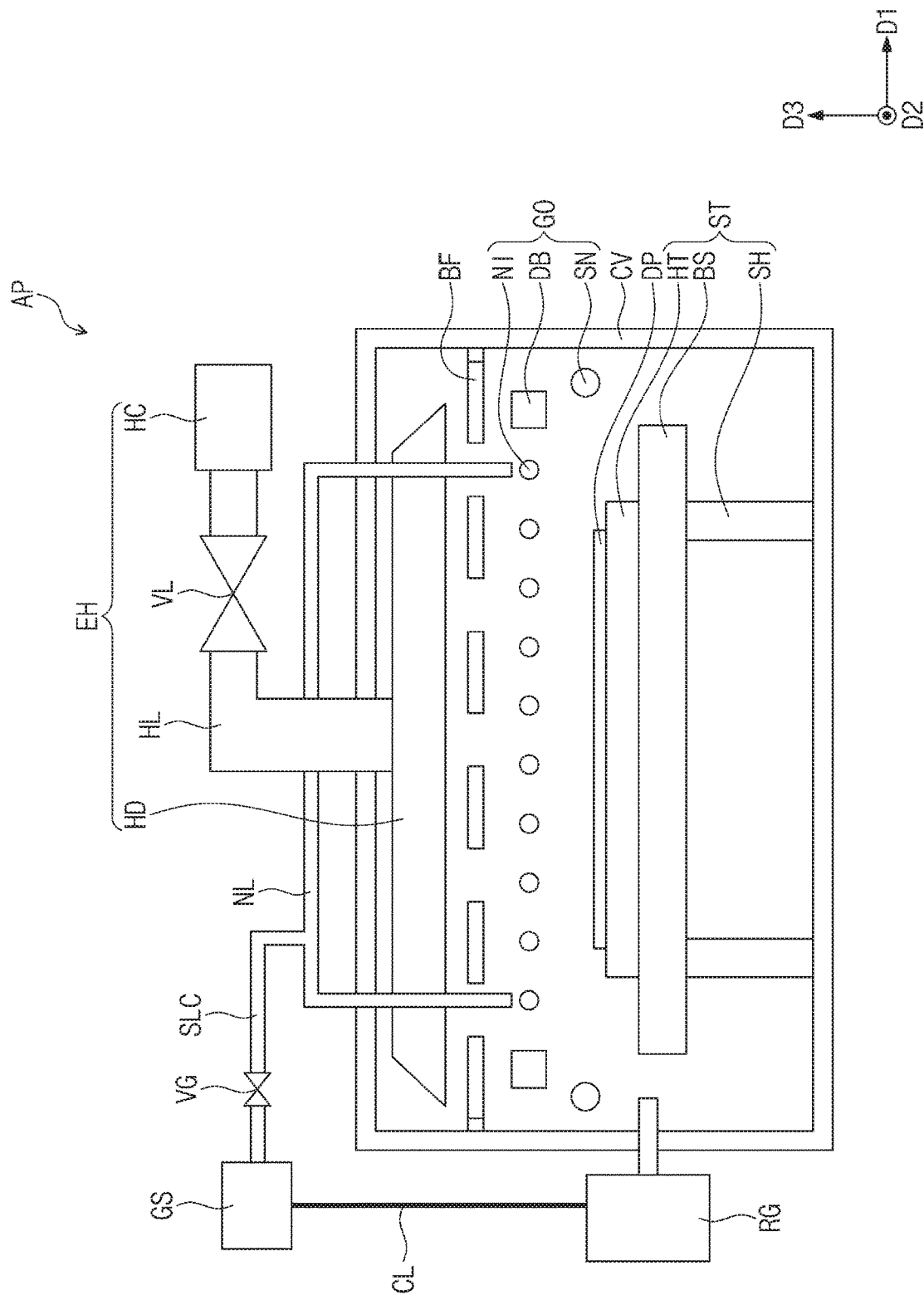
FIG. 1 is a sectional view schematically illustrating a bake system according to an embodiment of the inventive concept.

It should be noted that these drawings are intended to illustrate the general characteristics of methods, structure, and/or materials utilized in certain example embodiments and to supplement the written description provided below. These drawings are not, however, to scale and may not precisely reflect the precise structural or performance characteristics of any given example embodiment, and should not be interpreted as defining or limiting a range of values or properties encompassed by the example embodiments. For example, the relative thicknesses and positioning of molecules, layers, regions, and/or structural elements may be reduced or exaggerated for clarity. The use of similar or identical reference numbers in the drawings is intended to indicate the presence of a similar or identical element or feature.

DETAILED DESCRIPTION

Example embodiments of the inventive concepts will now be described more fully with reference to the accompanying drawings, in which example embodiments are illustrated. The example embodiments of the inventive concepts may, however, be embodied in many different forms and should not be construed as being limited to the example embodiments set forth herein; rather, these embodiments are provided so that the present disclosure will be thorough and complete, and will fully convey the inventive concept of the example embodiments to those of ordinary skill in the art. In the drawings, thicknesses of layers and regions are exaggerated for clarity. Like reference numerals in the drawings denote like elements, and thus their repeated description will be omitted.

It will be understood that when an element is referred to as being "connected" or "coupled" to another element, it can be directly connected or coupled to the other element or one or more intervening elements may be present. In contrast, when an element is referred to as being "directly connected" or "directly coupled" to another element, there are no intervening elements present therebetween. Like numbers indicate like elements throughout the present disclosure. As used herein the term "and/or" includes any and all combinations of one or more of the associated listed items. Other words used to describe a relationship between elements or layers should be interpreted in a like fashion (e.g., "between" versus "directly between," "adjacent" versus "directly adjacent," "on" versus "directly on").

It will be understood that, although the terms "first," "second," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed herein could be termed a second element, component, region, layer, or section without departing from the teachings of the example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of a system, a device, an element, a layer, or the like in use or operation in addition to the orientation depicted in the figures. For example, if the system, the device, the element, or the layer in the figures is turned over, elements described as "below" or "beneath" other elements or features would then be oriented "above" the other elements or features. Thus, the exemplary term "below" can encompass both an orientation of above and below. The system, the device, the element, or the layer may be otherwise oriented (rotated 90 degrees or at other orientations), and the spatially relative descriptors used herein are interpreted accordingly.

The terminology used herein is for the purpose of describing particular embodiments and is not intended to be limiting of the example embodiments. As used herein, the singular forms "a," "an," and "the" are intended to include plural forms as well, unless the context clearly indicates otherwise. It will be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Some of the example embodiments of the inventive concepts are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, the example embodiments of the inventive concepts should not be construed as limited to the particular shapes of regions illustrated herein but are to include deviations in shapes that may result, for example, from manufacturing.

Unless otherwise defined, terms (including technical and scientific terms) used herein have the same meaning as commonly understood by one of ordinary skill in the art to which the example embodiments of the inventive concepts belong. It will be further understood that terms, such as those defined in commonly-referenced dictionaries, should be interpreted as having a meaning that is consistent with their meaning in the context of the relevant art and will not be interpreted in an idealized or overly formal sense unless expressly so defined herein.

FIG. 1 is a sectional view schematically illustrating a bake system according to an embodiment of the inventive concept. Hereinafter, the structure of the bake system will be described in more detail with reference to FIG. 1.

Referring to FIG. 1, a bake system AP according to an embodiment of the inventive concept may include a chamber CV, a stage ST, a gas supplier GS, a gas ejection structure GO, an exhaust structure EH, a guide part BF, and an atmosphere analyzer RG.

The chamber CV may define an internal space. Some elements of the bake system AP are disposed in the internal space of the chamber CV. The internal space of the chamber CV may be an isolated space that can be hermetically sealed from the external atmosphere. The chamber CV may isolate a target substrate DP from the external atmosphere, and a bake process for forming a desired thin film on the target substrate DP can be performed in the internal space. Although not shown, a door may be provided in a sidewall of the chamber CV to allow the target substrate DP to enter and exit the internal space of the chamber CV.

The stage ST may include a loading part BS, a supporting part SH, and a heating part HT. The stage ST may be disposed in the internal space of the chamber CV to support the target substrate DP. The stage ST may be disposed in a lower portion of the chamber CV.

The target substrate DP may be disposed on the loading part BS. The heating part HT may be disposed between the loading part BS and the target substrate DP and may provide heat to the target substrate DP. However, the inventive concept is not limited to this example, and in an embodiment, the heating part HT may be provided as an internal element of the loading part BS.

The supporting part SH may support the loading part BS. The supporting part SH may include a lifting apparatus for adjusting a height of the loading part BS in the internal space of the chamber CV. FIG. 1 illustrates a pair of the supporting parts SH that are disposed to support opposite ends of the loading part BS, but the inventive concept is not limited to this example. For example, the supporting part SH may include a revolving apparatus that is disposed at a center of the loading part BS to revolve the loading part BS to adjust the height of the loading part BS.

The bake system AP may include the gas supplier GS, a supply conduit SLC, and a gas valve VG. The gas supplier GS may be disposed outside the chamber CV and may supply a process gas to the chamber CV. The supply conduit SLC may be a conduit that is used to deliver the process gas that is provided from the gas supplier GS into the chamber CV. The gas valve VG may open/close the supply conduit SLC and may control a flow rate of the process gas that is provided from the gas supplier GS into the chamber CV.

Figure 5A:
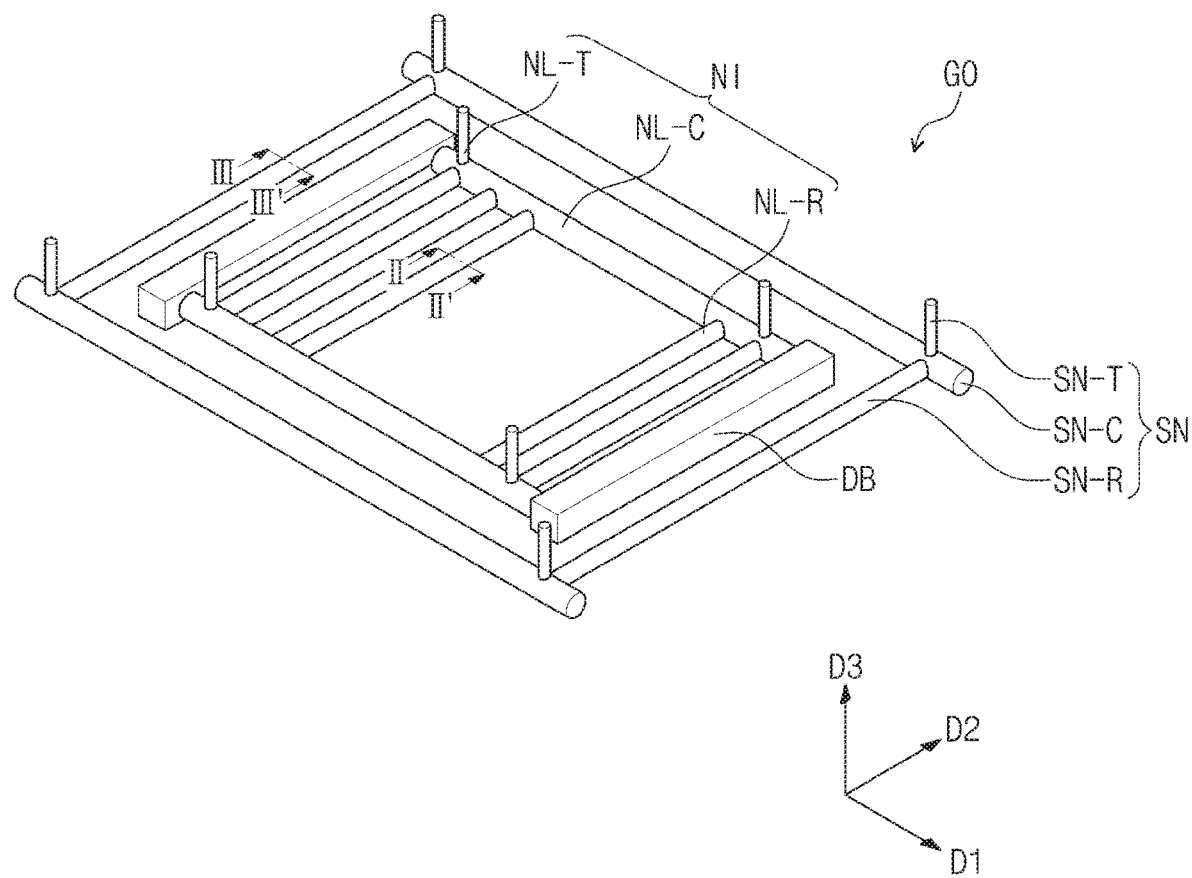
FIG. 5A is a perspective view illustrating a component of a bake system according to an embodiment of the inventive concept.
Figure 8:
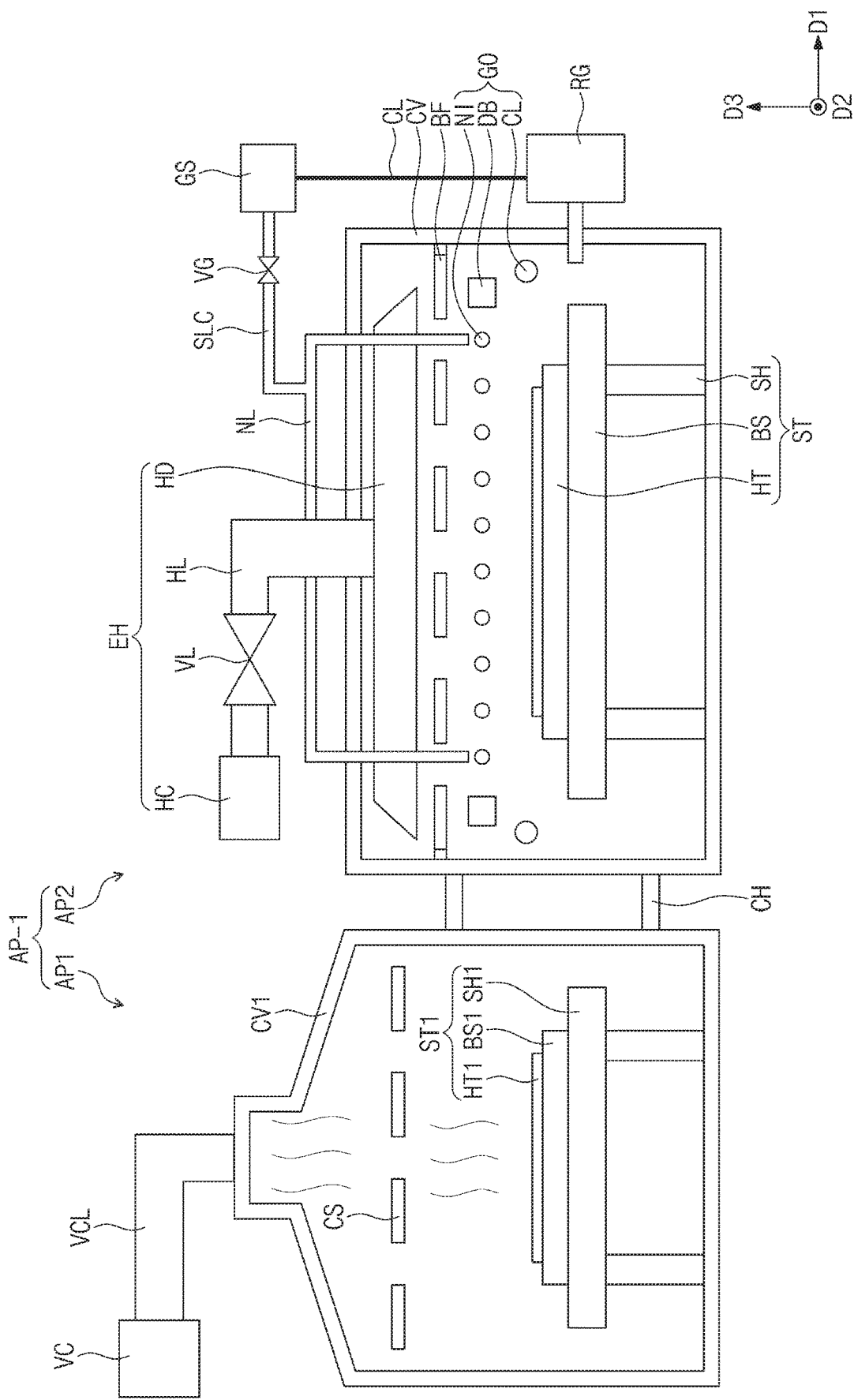
FIG. 8 is a sectional view schematically illustrating a bake system according to an embodiment of the inventive concept.

The gas ejection structure GO may include a first ejection structure NI, a dummy part DB, a second ejection structure SN, and a distribution conduit NL (shown, e.g., in FIG. 5A or FIG. 8). The gas ejection structure GO may be connected to the supply conduit SLC and may be used to eject the process gas that is provided from the gas supplier GS into the chamber CV.

The first ejection structure NI may be disposed in the chamber CV. For example, the first ejection structure NI may be disposed over the stage ST. The first ejection structure NI may be connected to the supply conduit SLC to eject the process gas that is provided from the gas supplier GS toward the target substrate DP. The process gas that is ejected from the first ejection structure NI can react with an organic solution included in the target substrate DP. For example, the process gas may be an inactive gas. At least one of nitrogen ($N_2$) gas, argon (Ar) gas, hydrogen (H2) gas, carbon monoxide (CO) gas, and any combination thereof may be used as the inactive gas.

The dummy part DB may be disposed along an edge of the first ejection structure NI. The dummy part DB may be disposed between the first ejection structure NI and the second ejection structure SN. For example, the dummy part DB may extend in a first direction D1 and a second direction D2 to enclose the first ejection structure NI. The dummy part DB may prevent impurity, moisture, and oxygen that may be produced by an airflow in the chamber CV from entering the target substrate DP.

The second ejection structure SN may be spaced apart from the first ejection structure NI with the dummy part DB interposed therebetween. The second ejection structure SN may be disposed along an edge of the dummy part DB. For example, the second ejection structure SN may extend in the first direction D1 and the second direction D2 to enclose the dummy part DB. Although not shown in FIG. 1, the second ejection structure SN may be connected to the supply conduit SLC and may eject the process gas that is provided from the gas supplier GS to produce an airflow in the chamber CV.

According to an embodiment of the inventive concept, the dummy part DB and the second ejection structure SN may separate the internal space of the chamber CV into at least two separate regions, one of which is used to perform the bake process on the target substrate DP. For example, an airflow produced by the second ejection structure SN may be blocked by the dummy part DB and may be prevented from being connected to an airflow formed on the target substrate DP.

The exhaust structure EH may include a suction part HD, an exhaust part HL, and an exhaust control part HC. The exhaust structure EH may be used to exhaust the process gas, impurity, moisture, and oxygen from the inside of the chamber CV to the outside.

The suction part HD may be disposed in the chamber CV. For example, the suction part HD may be disposed adjacent to an upper region of the chamber CV. The suction part HD may be disposed above the gas ejection structure GO. The suction part HD may effectively suction airflows flowing from a lower region of the chamber CV toward the upper region. The suction part HD may have an inclined side surface so that the lower portion thereof is wider than the upper portion thereof as illustrated in FIG. 1. Thus, it may be possible to reduce a difference in a passage length of the airflows suctioned at edge and center regions of the chamber CV.

The exhaust part HL may be connected to the suction part HD and may be disposed outside the chamber CV. The exhaust part HL may be a pathway through which the airflows suctioned by the suction part HD are exhausted to the outside.

The exhaust control part HC may be disposed outside the chamber CV and may control or maintain an internal pressure of the chamber CV. For example, the exhaust control part HC may exhaust an internal airflow of the chamber CV to the outside of the chamber CV, thereby controlling an internal pressure of the chamber CV. This may control an ambience of the chamber CV to generate an environment suitable for a thin film on the target substrate DP. In addition, the exhaust control part HC may quickly suction impurity, moisture, and/or oxygen that may be produced during a bake process while maintaining an internal pressure of the chamber CV. The exhaust control part HC may be or include at least one of a dry pump and a turbo pump.

A suction valve VL may open or close the exhaust part HL and may control a flow rate of the exhaust airflow to the outside of the chamber CV.

The atmosphere analyzer RG may be disposed near the chamber CV. The atmosphere analyzer RG may monitor or measure an internal environmental condition of the chamber CV. For example, the atmosphere analyzer RG may monitor amounts of impurity, moisture, and oxygen in the chamber CV before a bake process of the target substrate DP. The atmosphere analyzer RG may also monitor the amounts of impurity, moisture, and oxygen that are produced from the chamber CV and the target substrate DP during the bake process. The atmosphere analyzer RG enables the bake process of the target substrate DP to be performed in a desired environment by monitoring the amounts of impurity, moisture, and oxygen before and/or during the bake process. In addition, the atmosphere analyzer RG may monitor amounts of impurity, moisture, and oxygen that may remain in the chamber CV after the bake process, and this may make it possible to perform a subsequent process in a desired internal environmental condition of the chamber CV.

The atmosphere analyzer RG may be, for example, a residual atmosphere analyzer (RGA). However, the inventive concept is not limited to this example, and any analyzer that can monitor an amount of moisture and oxygen in the chamber CV may be used as the atmosphere analyzer RG.

A connection line CL may connect the atmosphere analyzer RG to the gas supplier GS. Information on the amounts of impurity, moisture, and oxygen in the chamber CV may be provided from the atmosphere analyzer RG to the gas supplier GS through the connection line CL, and based on the information provided from the atmosphere analyzer RG, the gas supplier GS may supply a process gas (herein also referred to as a reaction gas) into the chamber CV to control the internal environmental condition of the chamber CV to a desired condition adequate for the bake process.

According to an embodiment of the inventive concept, since the atmosphere analyzer RG monitoring the internal environmental condition of the chamber CV is provided in the bake system AP, it may be possible to remove not only moisture and oxygen that are produced before and after the bake process, but also moisture and oxygen that may be produced from the target substrate DP and from the internal space of the chamber CV during the bake process. Therefore, the bake system AP can improve reliability of the target substrate DP that is obtained by the bake process.

Figure 2:
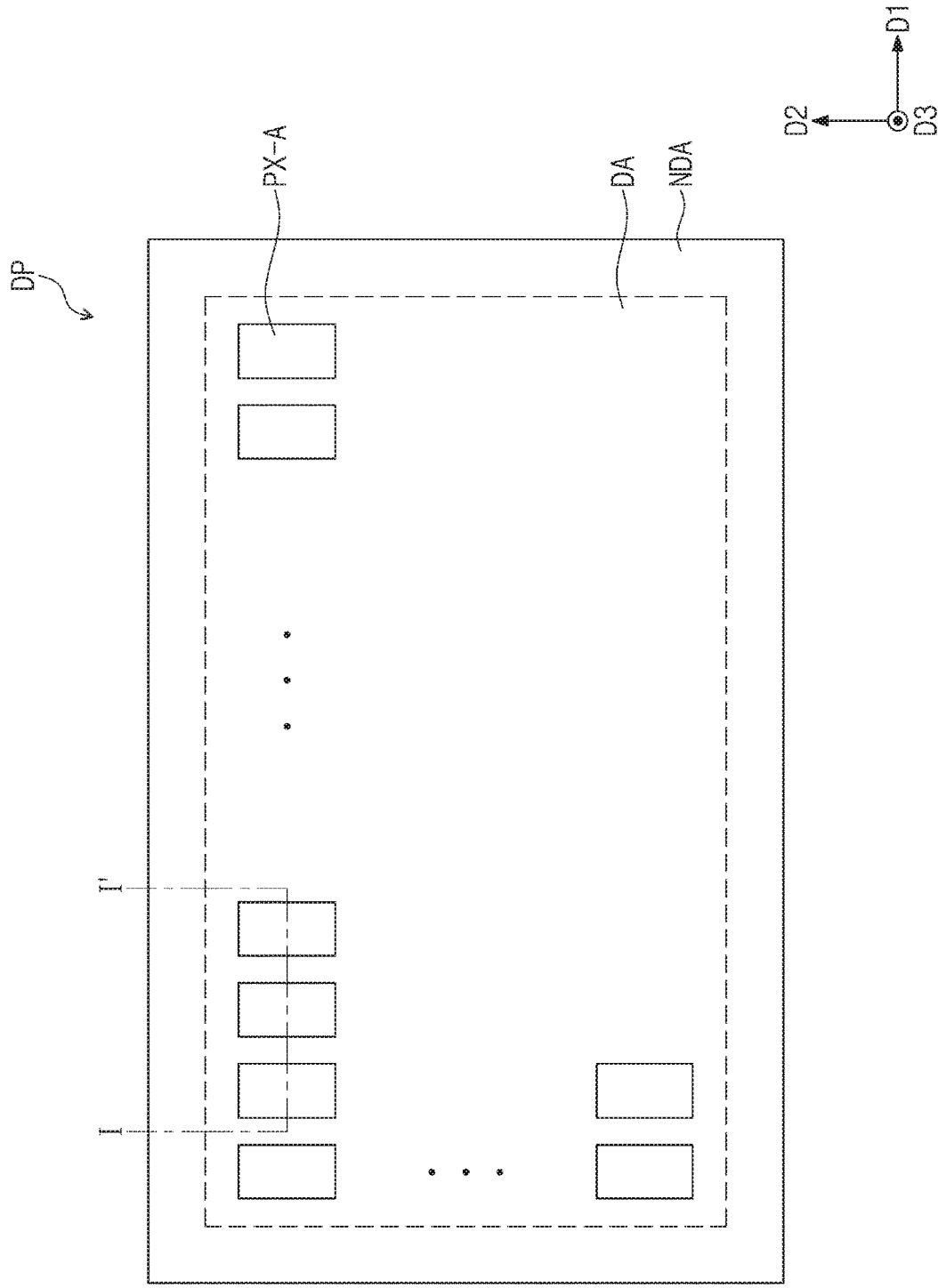
FIG. 2 is a plan view illustrating a target substrate according to an embodiment of the inventive concept.
Figure 4A:
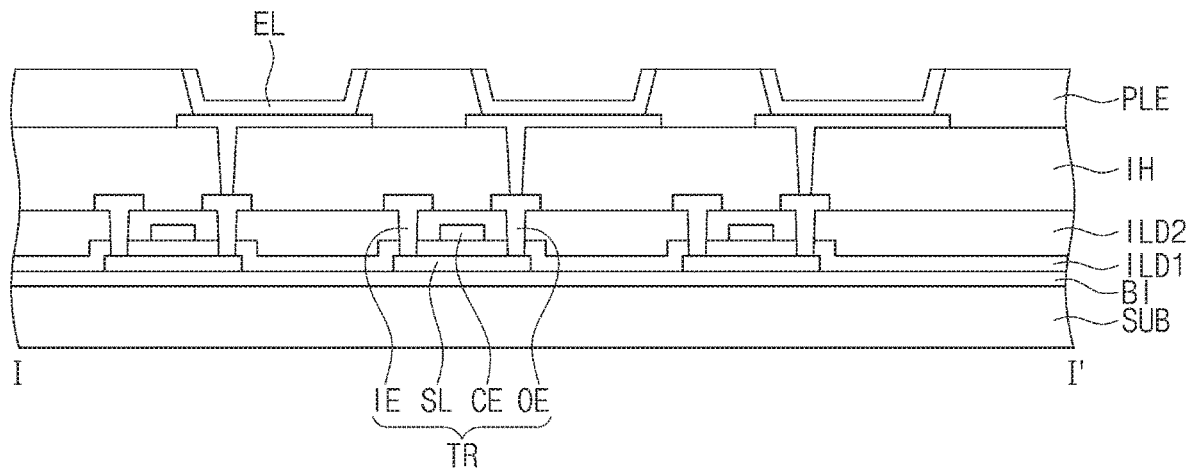
FIGS. 4A and 4B are sectional views illustrating a display device according to an embodiment of the inventive concept.
Figure 4B:
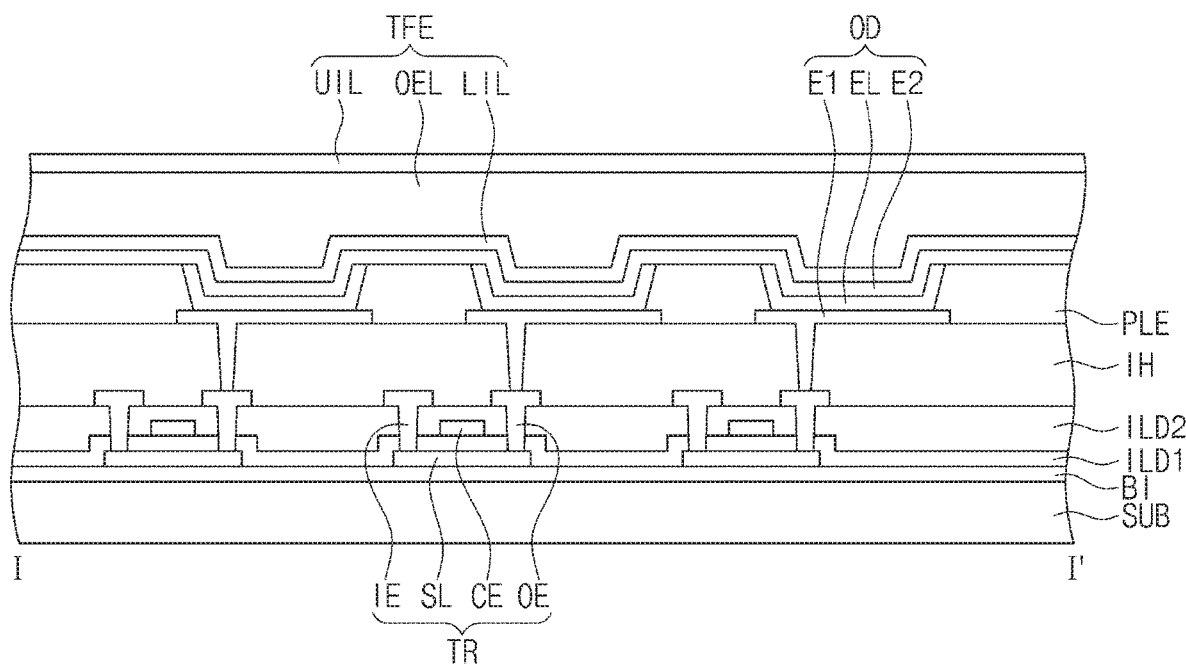

FIG. 2 is a plan view illustrating a target substrate according to an embodiment of the inventive concept. FIG. 3 is a sectional view taken along a line I-I' of FIG. 2. FIGS. 4A and 4B are sectional views illustrating a display device according to an embodiment of the inventive concept. In the following description, the same element described with referenced to FIG. 1 will be identified by the same or similar reference number without repeating an overlapping description thereof.

Referring to FIGS. 2 and 3, the target substrate DP may include a base layer SUB, a plurality of preliminary pixels PX-A, a barrier layer BI, a first insulating layer ILD1, a second insulating layer ILD2, a third insulating layer IH, and a pixel definition layer PLE. The target substrate DP may be divided into a display area DA and a non-display area NDA surrounding the display area DA.

In the target substrate DP, the plurality of preliminary pixels PX-A may be arranged in a matrix shape. Each of the preliminary pixels PX-A may include a transistor TR, a first electrode E1, and a preliminary organic layer EL-A.

The base layer SUB may be an underlying layer, on which other elements of the target substrate DP are disposed. In one embodiment, the base layer SUB may include a synthetic resin layer. The base layer SUB may be a flexible polyimide-based resin layer, but the inventive concept is not limited to this example. In another embodiment, the base layer SUB may include a rigid glass substrate, a metal substrate, or an organic/inorganic composite substrate.

The barrier layer BI may be disposed on the base layer SUB. The barrier layer BI may cover the base layer SUB. The barrier layer BI may be an insulating layer including an inorganic material. For example, the barrier layer BI may be formed of or include at least one of aluminum oxide ($AlO_x$), titanium oxide ($TiO_x$), silicon oxide ($SiO_x$), silicon oxynitride ($SiO_xN_y$), zirconium oxide ($ZrO_x$), and hafnium oxide ($HfO_x$). The barrier layer BI may have a multi-layered structure including a plurality of inorganic layers. The barrier layer BI may prevent an external contamination material from passing therethrough.

The transistor TR may include a semiconductor pattern SL, a control electrode CE, an input electrode IE, and an output electrode OE. The transistor TR may control a flow of electric charges passing through the semiconductor pattern SL in response to an electric signal applied to the control electrode CE. For example, the transistor TR may output an electrical signal from the input electrode IE to the output electrode OE, in response to an electric signal applied to the control electrode CE.

The semiconductor pattern SL may be disposed on the base layer SUB. The semiconductor pattern SL may include at least one of a crystalline semiconductor material, a metal oxide semiconductor material, poly silicon, and amorphous silicon. In FIG. 3, the control electrode CE of the transistor TR is illustrated to be disposed on the semiconductor pattern SL, but the inventive concept is not limited to this example. In an embodiment, the control electrode CE may be disposed on the base layer SUB and may be covered with the first insulating layer ILD1, and the semiconductor pattern SL may be disposed on the first insulating layer ILD1. That is, the transistor TR may have a bottom-gate structure, but the inventive concept is not limited to this example or a specific embodiment.

The first insulating layer ILD1 may be disposed between the semiconductor pattern SL and the control electrode CE. The first insulating layer ILD1 may cover the base layer SUB and the semiconductor pattern SL. The first insulating layer ILD1 may include an inorganic material, but the inventive concept is not limited to this example or a specific embodiment.

The control electrode CE may be disposed on the semiconductor pattern SL. The control electrode CE may be spaced apart from the semiconductor pattern SL with the first insulating layer ILD1 interposed therebetween. The control electrode CE may overlap at least a portion of the semiconductor pattern SL.

The second insulating layer ILD2 may be disposed between the control electrode CE and the input electrode IE and between the control electrode CE and the output electrode OE. The second insulating layer ILD2 may cover the first insulating layer ILD1 and the control electrode CE. The second insulating layer ILD2 may include an inorganic material, but the inventive concept is not limited to this example or a specific embodiment.

The input electrode IE and the output electrode OE may be disposed on the second insulating layer ILD2. The input electrode IE and the output electrode OE may penetrate through the first insulating layer ILD1 and the second insulating layer ILD2 and may be coupled to two different portions of the semiconductor pattern SL, respectively. However, the inventive concept is not limited to these examples, and in an embodiment, the input electrode IE and the output electrode OE may be directly coupled to the semiconductor pattern SL.

The third insulating layer IH may be disposed on the second insulating layer ILD2. The third insulating layer IH may cover the transistor TR. The third insulating layer IH may be disposed between the transistor TR and the pixel definition layer PLE.

The pixel definition layer PLE may be disposed on the third insulating layer IH. A plurality of openings may be defined in the pixel definition layer PLE. The pixel definition layer PLE may include an organic material.

The first electrode E1 may be disposed on the third insulating layer IH. The first electrode E1 may penetrate through the third insulating layer IH and may be electrically coupled to the transistor TR. In an embodiment, a plurality of the first electrodes E1 may be provided. At least a portion of each of the first electrodes E1 may be exposed by a corresponding one of the openings defined in the pixel definition layer PLE.

The preliminary organic layer EL-A may be disposed on the first electrode E1 that is exposed by the opening of the pixel definition layer PLE. According to an embodiment of the inventive concept, the preliminary organic layer EL-A may be formed by ejecting an organic solution onto an opening of the pixel definition layer PLE using a solution coating method (e.g., an inkjet printing method or a nozzle printing method) and then by drying the organic solution for a specific time to remove at least a portion of an organic solvent from the organic solution.

The organic solution may be one of, for example, hole injection solution, hole transport solution, light-emitting solution, electron transport solution, and electron injection solution, but the inventive concept is not limited to this example or a specific embodiment.

The bake process according to an embodiment of the inventive concept may remove a remaining organic solvent of the preliminary organic layer EL-A from the target substrate DP.

Referring to FIGS. 4A and 4B, the bake process is performed on the preliminary organic layer EL-A to remove the remaining organic solvent from the preliminary organic layer EL-A and as a result, an organic layer EL having a desired layer thickness may be formed. The organic layer EL that is formed after the bake process may correspond to an element of an organic light emitting element OD. For example, the organic layer EL may include at least one of a hole injection layer, a hole transport layer, a light emitting layer, an electron transport layer, and an electron injection layer.

The organic layer EL may be disposed on the first electrode E1. After the bake process, the organic layer EL may be formed to have a desired thickness on the first electrode E1 and provide a flat surface. In an embodiment, the organic layer EL may refer to a plurality of organic layers that are formed by repeating a printing process, a drying process, and a bake process. For example, the organic layer EL may be a multi-layered structure, in which a hole injection layer, a hole transport layer, an organic light emitting layer, an electron transport layer, and an electron injection layer are stacked.

A second electrode E2 may be disposed on the organic layer EL and the pixel definition layer PLE. The second electrode E2 may be provided in the form of a single or bulk pattern covering the pixel definition layer PLE and the first electrode E1. Accordingly, the organic light emitting element OD included in the pixel PX may include the first electrode E1, the organic layer EL, and the second electrode E2.

An encapsulation layer TFE may be disposed on the organic light emitting element OD. The encapsulation layer TFE may cover the organic light emitting element OD and may prevent external impurity, moisture, and oxygen from entering the organic light emitting element OD. The encapsulation layer TFE may include an inorganic layer and/or an organic layer. For example, the encapsulation layer TFE may include a first inorganic layer LIL, an organic layer OEL, and a second inorganic layer UIL. The first inorganic layer LIL may be disposed on the second electrode E2. The second inorganic layer UIL may be spaced apart from the first inorganic layer LIL with the organic layer OEL interposed therebetween. The second inorganic layer UIL, along with the first inorganic layer LIL, may seal or encapsulate the organic layer OEL.

Each of the first inorganic layer LIL and the second inorganic layer UIL may include an inorganic material. For example, each of the first inorganic layer LIL and the second inorganic layer UIL may be formed of or include at least one of aluminum oxide ($AlO_x$), silicon oxide ($SiO_x$), silicon nitride ($SiN_x$), silicon oxynitride ($SiO_xN_y$), silicon carbide ($SiC_x$), titanium oxide ($TiO_x$), zirconium oxide ($ZrO_x$), and zinc oxide ($ZnO_x$).

The organic layer OEL may be disposed between the first inorganic layer LIL and the second inorganic layer UIL. The organic layer OEL may be formed of or include an organic material. For example, the organic layer OEL may be formed of or include at least one of epoxy, polyimide, polyethylene terephthalate, polycarbonate, polyethylene, and polyacrylate.

The bake process performed on the preliminary organic layer EL-A may include ejecting an inactive gas from the first ejection structure NI toward the preliminary organic layer EL-A through the first ejection structure NI. The inactive gas ejected from the first ejection structure NI may be in contact with the preliminary organic layer EL-A and may produce an airflow toward the suction part HD.

If, when the airflow is produced, the bake system AP performs an exhaust step to reduce an internal pressure of the chamber CV, a remaining organic solvent may evaporate from the preliminary organic layer EL-A, and thus, the organic layer EL having a flat surface may be formed. Here, the inactive gas ejected from the first ejection structure NI may prevent moisture, oxygen, and impurity that remains in the organic solvent during and/or after the drying process from entering the preliminary organic layer EL-A.

In addition, the process gas ejected through the second ejection structure SN may produce an airflow exhaust impurity, moisture, and oxygen that are escaped from the internal space of the chamber during the bake process to the outside through the exhaust structure EH, and thus, the organic layer EL may be fabricated to have an improved reliability property.

According to an embodiment of the inventive concept, during the bake process, the atmosphere analyzer RG may be used to monitor amounts of impurity, moisture, and oxygen in the chamber CV, and to the bake system AP may control a flow rate of the reaction gas provided from the gas supplier GS and thereby to fabricate the organic layer EL with desired characteristics.

Figure 5B:
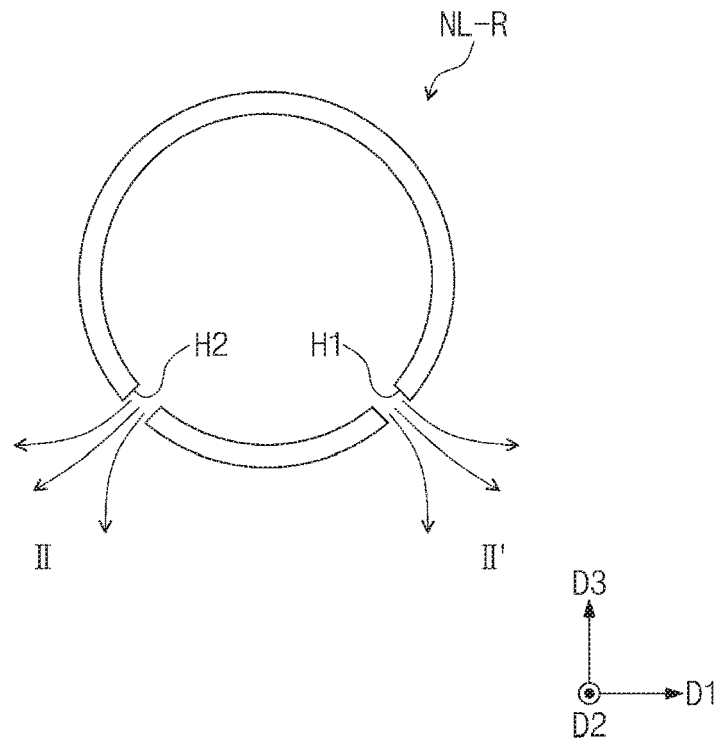
FIG. 5B is a sectional view taken along a line II-II' of FIG. 5A.
Figure 5C:
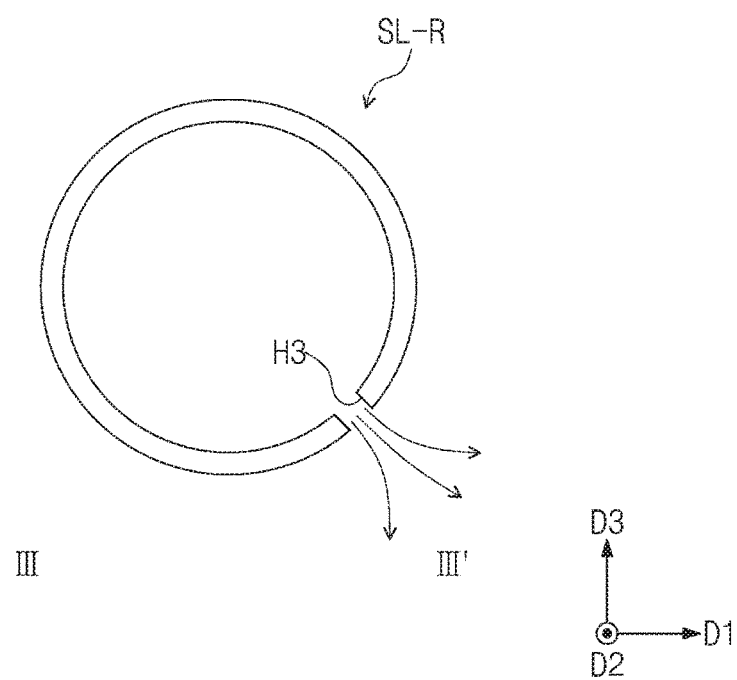
FIG. 5C is a sectional view taken along a line III-III' of FIG. 5A.
Figure 5D:
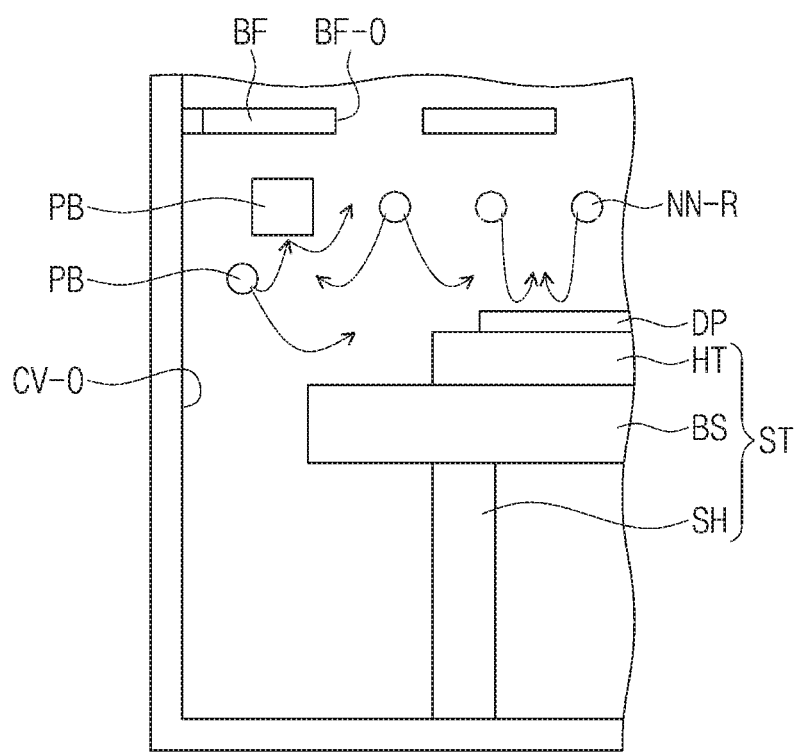
FIG. 5D is a sectional view illustrating components of a bake system according to an embodiment of the inventive concept.

FIG. 5A is a perspective view illustrating a component of a bake system according to an embodiment of the inventive concept. FIG. 5B is a sectional view taken along a line II-II' of FIG. 5A. FIG. 5C is a sectional view taken along a line III-III' of FIG. 5A. FIG. 5D is a sectional view illustrating components of a bake system according to an embodiment of the inventive concept.

Referring to FIG. 5A, the gas ejection structure GO may include the first ejection structure NI, the dummy part DB, and the second ejection structure SN. The first ejection structure NI may include a first transfer pipe NL-T, a first distribution pipe NL-C, and a first ejection pipe NL-R. The second ejection structure SN may include a second transfer pipe SN-T, a second distribution pipe SN-C, and a second ejection pipe SN-R.

The first transfer pipe NL-T may be connected to the supply conduit SLC (e.g., see FIG. 1). The first transfer pipe NL-T may extend in a third direction D3. The first transfer pipe NL-T may transfer the process gas that is provided through the supply conduit SLC to the first distribution pipe NL-C. In an embodiment, the first ejection structure NI may include a plurality of first transfer pipes NL-T that are connected to two or more portions of the first distribution pipe NL-C.

The first distribution pipe NL-C may extend in the first direction D1 and may be connected to the first ejection pipe NL-R. The first distribution pipe NL-C may provide the process gas that is provided from the first transfer pipe NL-T to the first ejection pipe NL-R. In an embodiment, the first ejection structure NI may include a plurality of first distribution pipes NL-C that are connected to two opposite ends of the first ejection pipe NL-R. Thus, the first distribution pipes NL-C may support the first ejection pipe NL-R.

The first ejection pipe NL-R may extend in the second direction D2 and may be used to eject the process gas that is provided from the first distribution pipe NL-C onto the target substrate DP. The first ejection pipe NL-R may include a plurality of ejection holes that are used to eject the process gas. For example, the first ejection pipe NL-R may include a first ejection hole H1 and a second ejection hole H2 that are spaced apart from each other. The ejection holes H1 and H2 may be defined to penetrate the first ejection pipe NL-R.

The dummy part DB may be disposed between the first ejection structure NI and the second ejection structure SN. In an embodiment, the dummy part DB may extend in the second direction D2. The gas ejection structure GO may include a plurality of the dummy parts DB that are disposed at opposite ends of the first distribution pipes NL-C.

According to an embodiment of the inventive concept, the dummy part DB and the second ejection structure SN may separate the internal space of the chamber CV into at least two separate regions, one of which is used to perform the bake process on the target substrate DP. For example, an airflow produced by the second ejection structure SN may be blocked by the dummy part DB and may be prevented from being connected to an airflow formed on the target substrate DP.

The second ejection structure SN may be disposed spaced apart from the first ejection structure NI and the dummy part DB. The second ejection structure SN may extend in the first direction D1 and the second direction D2 to enclose the first ejection structure NI and the dummy part DB.

The second transfer pipe SN-T may be connected to the supply conduit SLC (e.g., see FIG. 1). The second transfer pipe SN-T may extend in the third direction D3. The second transfer pipe SN-T may transfer the process gas that is provided through the supply conduit SLC to the second distribution pipe SN-C. The second ejection structure SN may include a plurality of the second transfers pipe SN-T that are connected to two or more portions of the second distribution pipe SN-C.

The second distribution pipe SN-C may extend in the first direction D1 and may be connected to the second ejection pipe SN-R. The second distribution pipe SN-C may provide the process gas that is provided from the second transfer pipe SN-T to the second ejection pipe SN-R. The second ejection structure SN may include a plurality of the second distribution pipes SN-C that are connected to two opposite ends of the second ejection pipe SN-R. Thus, the second distribution pipes SN-C may support the second ejection pipe SN-R.

The second ejection pipe SN-R may extend in the second direction D2 and may be used to eject the process gas that is provided from the second distribution pipe SN-C to the internal space of the chamber CV, except the target substrate DP. The second ejection pipe SN-R may include a third ejection hole H3 that is used to eject the process gas. The third ejection hole H3 may be defined to penetrate the second ejection pipe SN-R.

Referring to FIGS. 5B to 5D, the first ejection hole H1 and the second ejection hole H2 may be formed to produce an airflow in different directions. When viewed in a sectional view, the first ejection pipe NL-R may include a plurality of paired ejection holes that are spaced apart from each other in the second direction D2, and here, each of the paired ejection holes includes the ejection holes H1 and H2 spaced apart from each other in the first direction D1. In an embodiment, the plurality of first ejection pipes NL-R may be arranged in the first direction D1. Adjacent ones of the first ejection pipes NL-R may be disposed such that the first and second ejection holes H1 and H2 thereof face each other.

According to an embodiment of the inventive concept, since the plurality of the paired ejection holes are arranged in the second direction D2, the process gas may be uniformly ejected from the plurality of first ejection pipes NL-R toward the target substrate DP.

Referring to FIG. 5D, an airflow that is produced by the process gas ejected from the third ejection hole H3 may flow toward an upper portion of the chamber CV and may be blocked by the dummy part DB, and thus, it may be separated from the airflow produced on the target substrate DP. The airflow that is produced by the process gas ejected from the third ejection hole H3 may be prevented from flowing toward an inner sidewall CV-O of the chamber CV preventing impurity, moisture, and oxygen from entering onto the target substrate DP.

FIG. 6 is a perspective view illustrating a component of a bake system according to an embodiment of the inventive concept. FIG. 7 is a sectional view taken along a line IV-IV' of FIG. 6. In the following description, the same element described with reference to FIG. 1 will be identified by the same or similar reference number without repeating an overlapping description thereof.

Referring to FIG. 6, the guide part BF according to an embodiment of the inventive concept may be disposed between the suction part HD (e.g., see FIG. 1) and the gas ejection structure GO. The guide part BF may include a plurality of openings BF-O. The guide part BF may be adjust flow of the airflow flowing from the target substrate DP toward the suction part HD and to realize a uniform exhaust airflow. Although not shown, the guide part BF may further include sub openings that are disposed at an edge region of the guide part BF and between the openings BF-O, but the inventive concept is not limited to this example or a specific embodiment.

Referring to FIG. 7, the bake system AP may further include a cooling part CP. The cooling part CP may be disposed in or integrated into the guide part BF. The cooling part CP may cool the moisture that is produced by heat supplied to the target substrate DP from the heating part HT (e.g., see FIG. 1) and remove the moisture from the chamber CV.

FIG. 8 is a sectional view schematically illustrating a bake system according to an embodiment of the inventive concept. In the following description, the same element described with reference to FIG. 1 will be identified by the same or similar reference number without repeating an overlapping description thereof.

A bake system AP-1 according to an embodiment of the inventive concept may include a first apparatus AP1, a second apparatus AP2, and a connecting portion CH. The second apparatus AP2 may correspond to the bake system AP described with reference to FIGS. 1 to 7.

The first apparatus AP1 may include a first chamber CV1, a first stage ST1, a cooling part CS, and a pump VC. The first chamber CV1 may define an internal space. Some components or elements of the first apparatus AP1 are disposed in the internal space of the first chamber CV1. The internal space of the first chamber CV1 may be isolated from the outer atmosphere. Thus, the first chamber CV1 may isolate the target substrate DP from the outer atmosphere.

The first stage ST1 may be disposed in the internal space of the first chamber CV1 to support the target substrate DP. The first stage ST1 may be disposed in a lower portion of the first chamber CV1. The first stage ST1 may include a first loading part BS1, a first supporting part SH1, and a first heating part HT1.

The first loading part BS1, the first supporting part SH1, and the first heating part HT1 of the first stage ST1 may have the same function as the loading part BS, the supporting part SH, and the heating part HT of the stage ST described with reference to FIG. 1.

The cooling part CS may be disposed in the internal space of the first chamber CV1. The cooling part CS may be disposed spaced apart from the first stage ST1. The cooling part CS may cool the moisture that is produced by heat supplied to the target substrate DP from the first heating part HT1 and remove the moisture from the first chamber CV1.

The pump VC may be disposed outside the first chamber CV1. The pump VC may exhaust impurity, moisture, and oxygen in the first chamber CV1 to the outside through a suction line VCL.

The connecting portion CH may be connected to each of the first apparatus AP1 and the second apparatus AP2 and may serve as a passageway of the target substrate DP between the first apparatus AP1 and the second apparatus AP2. The connecting portion CH may be connected to a side wall of each of the first apparatus AP1 and the second apparatus AP2 for loading/unloading or delivering the target substrate DP. The inventive concept is not limited to a specific method of delivering the target substrate DP to the first apparatus AP1 and the second apparatus AP2. That is, the method of delivering the target substrate DP may be variously changed without departing from the scope of the inventive concept.

The first apparatus AP1 may initially remove moisture and oxygen that may be supplied into the target substrate DP or included in the preliminary organic layer EL-A (e.g., see FIG. 2) on the target substrate DP, in a drying process that is performed on the target substrate DP before the bake process. Accordingly, the first apparatus AP1 may reduce an exhaust amount of moisture and oxygen that are produced by a bake process that uses the second apparatus AP2. This may reduce the process time and cost that are required to control amounts of moisture and oxygen in the second apparatus AP2.

In addition, moisture and oxygen that are included in the target substrate DP may be removed prior to the bake process, and then, the atmosphere analyzer RG of the second apparatus AP2 may be used to control amounts of moisture and oxygen before, during, and after the bake process. This may improve a life span of the organic layer EL (e.g., see FIG. 4A) that is formed on the target substrate DP.

Figure 9:
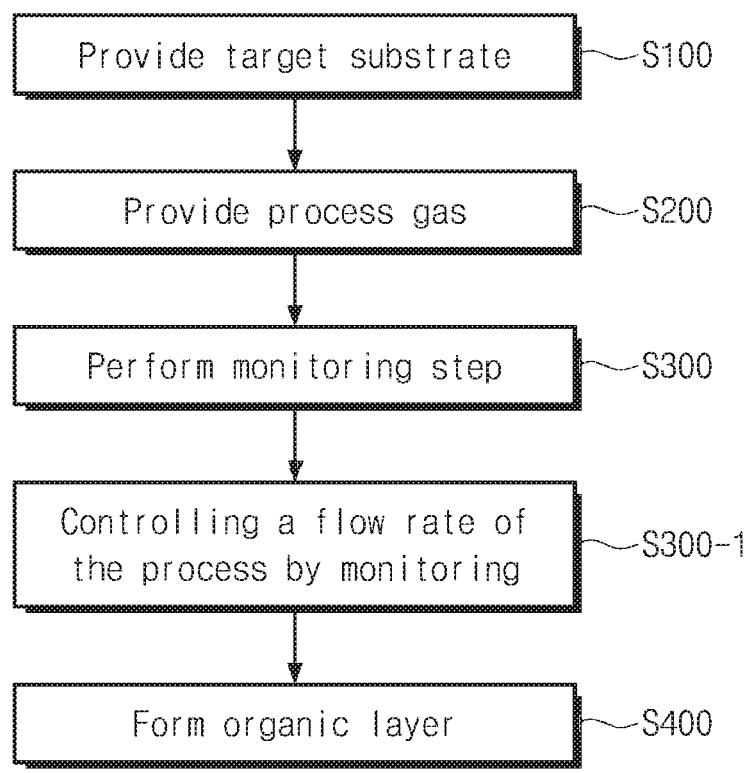
FIG. 9 is a block diagram illustrating a method of fabricating a display device according to an embodiment of the inventive concept.
Figure 10A:
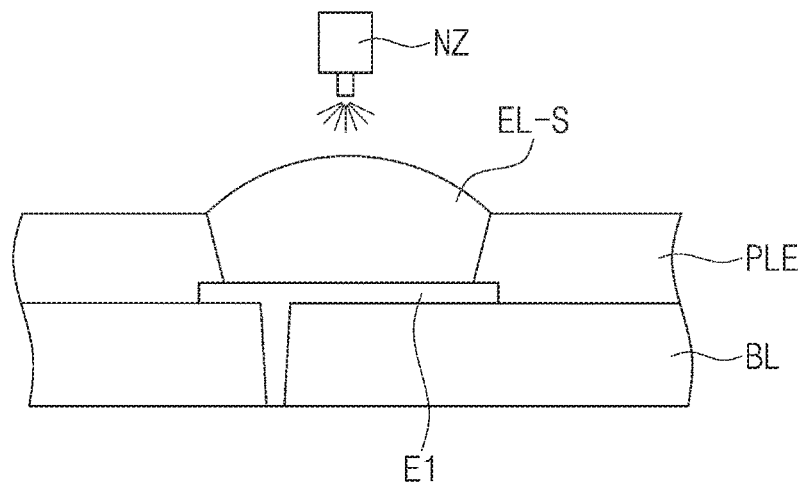
FIGS. 10A to 10C are sectional views of a display device according to an embodiment of the inventive concept.
Figure 10B:
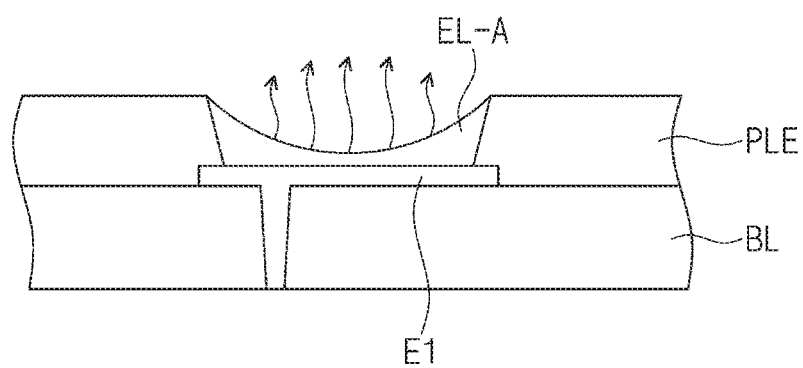
Figure 10C:
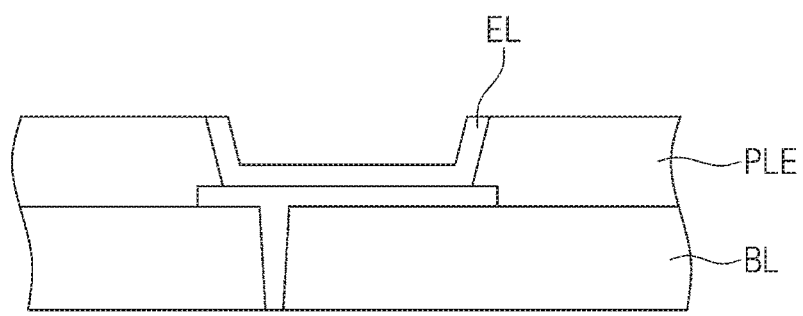

FIG. 9 is a block diagram illustrating a method of fabricating a display device according to an embodiment of the inventive concept. FIGS. 10A to 10C are sectional views of a display device according to an embodiment of the inventive concept. In the following description, the same element described with reference to FIGS. 1 to 8 will be identified by the same or similar reference number without repeating an overlapping description thereof.

Referring to FIG. 9, a method of fabricating a display device, according to an embodiment of the inventive concept, may include providing a target substrate (in S100), providing a process gas (in S200), performing a monitoring step (in S300), and forming an organic layer (in S400). The performing of the monitoring step may include controlling a flow rate of the process gas by monitoring (in S300-1). It is controlling a flow rate of a process gas based on the monitored internal environmental condition of the chamber. Hereinafter, a method of fabricating a display device, according to an embodiment of the inventive concept, will be described with reference to the bake system AP shown in FIG. 1.

Referring to FIG. 10A, a process of printing an organic solution on the target substrate DP (e.g., see FIG. 1) may be performed before the bake process according to an embodiment of the inventive concept. A base substrate BL may include the base layer SUB, the transistor TR, and the insulating layers BI, ILD1, ILD2, and IH of FIG. 4A.

The pixel definition layer PLE that has an opening may be formed on the base substrate BL, and the opening may overlap at least a portion of the first electrode E1. A nozzle NZ may eject an organic solution including an organic solvent onto the opening of the pixel definition layer PLE. The ejected organic solution may form an initial organic layer EL-S that may have a convex shape on the opening. The organic solution may be one of, for example, a hole injection solution, a hole transport solution, a light-emitting solution, an electron transport solution, and an electron injection solution, but the inventive concept is not limited to this example or a specific embodiment.

In an embodiment, a portion of the pixel definition layer PLE exposed by the initial organic layer EL-S may have a hydrophobic property. Thus, the initial organic layer EL-S may be locally formed in the opening without spreading onto an upper surface of the pixel definition layer PLE.

Next, referring to FIG. 10B, a drying process may be performed to remove the organic solvent included in the initial organic layer EL-S. The drying process may partially remove the organic solvent from the initial organic layer EL-S. As a result, the preliminary organic layer EL-A may be formed. For example, the drying process may remove 90% to 95% of the organic solvent in the initial organic layer EL-S.

The drying process may be performed at a room temperature. In this case, impurity, moisture, and oxygen in the atmosphere may enter the target substrate DP, and the organic layer EL of the organic light emitting element OD may suffer from deterioration in its life span and reliability. Thus, the bake process may be performed to remove impurity, moisture, and oxygen that enter the target substrate DP during the drying process.

Referring to FIG. 9, the providing of the target substrate (in S100) may include loading the target substrate DP, in which the preliminary organic layer EL-A is formed on the base substrate BL, on the stage ST.

In an embodiment, to remove impurity, moisture, and oxygen that may have entered the target substrate DP during the drying process, the providing of the target substrate (in S100) may further include removing moisture and oxygen from the target substrate DP using the first apparatus AP1 of FIG. 8.

Next, the providing of the process gas (in S200) may include ejecting the process gas that is provided from the gas supplier GS, into the chamber CV through the gas ejection structure GO.

Here, a flow rate of a reaction gas (or process gas) that is provided from the gas supplier GS may be controlled based on information regarding the internal environmental condition of the chamber CV that is provided by the atmosphere analyzer RG.

Next, the performing of the monitoring step (in S300) may include monitoring the internal environmental condition of the chamber CV using the atmosphere analyzer RG. Owing to a change in the environmental condition of the chamber CV that may occur during the bake process, moisture and oxygen may be produced from the chamber CV itself, and moisture and oxygen remaining in the target substrate DP may be infiltrated into the chamber CV.

According to an embodiment of the inventive concept, even when the bake process is being performed, the internal environmental condition of the chamber CV may be continuously monitored through the atmosphere analyzer RG, and a flow rate of the reaction gas that is provided from the gas supplier GS may be adjusted based on the result of the monitoring. Thus, the bake system AP can effectively remove impurity, moisture, and oxygen that may be produced during the bake process, and thereby to form the organic layer EL with improved reliability. In an embodiment, a concentration of the moisture in the chamber CV may be maintained to be lower than or equal to 0.3 ppm, during the bake process.

Next, referring to FIG. 10C, the step of forming the organic layer (in S400) may include removing the remaining organic solvent in the preliminary organic layer EL-A. The organic layer EL that has a desired thickness and a flat surface may be formed on the first electrode E1 by removing the remaining organic solvent.

In an embodiment, after the forming of the organic layer (in S400), an additional step may be further performed to remove moisture and oxygen from the internal space of the chamber CV. After the formation of the organic layer EL, the atmosphere analyzer RG may be used to monitor impurity, moisture, and oxygen remaining in the chamber CV, and it may be used to provide an internal environmental condition suitable for a subsequent process.

Figure 12:
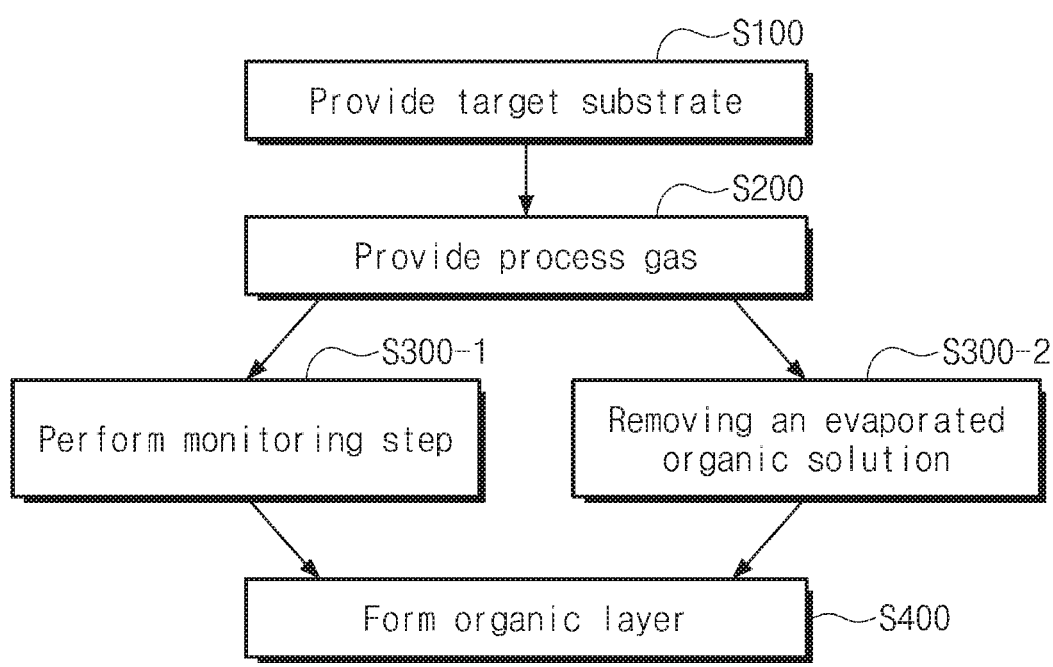
FIG. 12 is a block diagram illustrating a method of fabricating a display device, according to an embodiment of the inventive concept.

FIG. 11 is a sectional view schematically illustrating a bake system, according to an embodiment of the inventive concept. FIG. 12 is a block diagram illustrating a method of fabricating a display device, according to an embodiment of the inventive concept. In the following description, the same element described with reference to FIGS. 1 to 10C will be identified by the same or similar reference number without repeating an overlapping description thereof.

Referring to FIG. 11, a bake system AP-2 according to the present embodiment may include the chamber CV, the stage ST, the gas supplier GS, the gas ejection structure GO, the exhaust control part HC, the guide part BF, and the atmosphere analyzer RG, and the chamber CV may include cooling parts CTR1 and CTR2.

The stage ST, the gas supplier GS, the gas ejection structure GO, the exhaust control part HC, the guide part BF, and the atmosphere analyzer RG of the bake system AP-2 may be configured to have substantially the same features as the chamber CV, the stage ST, the gas supplier GS, the gas ejection structure GO, the exhaust control part HC, the guide part BF, and the atmosphere analyzer RG of the bake system AP described with reference to FIG. 1. Hereinafter, the cooling parts CTR1 and CTR2 will be described in more detail below.

The cooling parts CTR1 and CTR2 according to the present embodiment may provide environment capable of constantly evaporating the organic solution from the target substrate DP. Due to heat provided from the heating part HT, the organic solution provided on the target substrate DP may evaporate into the internal space of the chamber CV. If the evaporated organic solution in the internal space of the chamber CV becomes a saturation state, the organic solution may no longer evaporate from the target substrate DP. This may lead to failure of the organic layer EL (e.g., see FIG. 4A).

Since the cooling parts CTR1 and CTR2 provide a temperature that is lower than a boiling point of the organic solution, the organic solution that evaporated into the internal space of the chamber CV may be adsorbed onto the cooling parts CTR1 and CTR2. Thus, the bake system AP-2 can provide environment capable of constantly heating the target substrate DP and form the organic layer EL with improved reliability by evaporating the organic solution using the cooling parts CTR1 and CTR2.

The cooling parts CTR1 and CTR2 may be disposed in the internal space of the chamber CV. For example, the first cooling part CTR1 may be disposed to enclose an inner wall of the chamber CV. Furthermore, the second cooling part CTR2 may be disposed below the loading part BS. The second cooling part CTR2 may be disposed to be parallel to the loading part BS. Thus, the evaporated organic solution may be uniformly adsorbed.

Referring to FIG. 12, a method of fabricating a display device may include providing a target substrate (in S100), providing a process gas (in S200), performing a monitoring step (in S300-1), removing an evaporated organic solution (in S300-2), and forming an organic layer (in S400).

The providing of the target substrate (in S100), the providing of the process gas (in S200), the performing of the monitoring step (in S300-1), and the forming of the organic layer (in S400) may be performed in the same or substantially similar manner as the providing of the target substrate (in S100), the providing of the process gas (in S200), the performing of the monitoring step (in S300), and the forming of the organic layer (in S400) described with reference to FIG. 9.

The removing of the evaporated organic solution (in S300-2) according to the present embodiment may be performed by the cooling parts CTR1 and CTR2. Since the cooling parts CTR1 and CTR2 adsorb an evaporated organic solution onto an internal space of the chamber CV, to the bake system AP-2 can provide an internal environmental condition capable of constantly heating the target substrate DP and thereby evaporating the organic solution and to form the organic layer EL with improved reliability.

Furthermore, although not shown, after the bake process on the target substrate DP is finished, an additional step of heating the cooling parts CTR1 and CTR2 may be further performed after the chamber CV is emptied.

When the cooling parts CTR1 and CTR2 are heated, the organic solutions that are adsorbed on the cooling parts CTR1 and CTR2 may evaporate, and the cooling parts CTR1 and CTR2 may be returned to their initial states. The cooling parts CTR1 and CTR2 may be repeatedly reused or reworked, in a subsequent process.

A bake system according to an embodiment of the inventive concept may include an atmosphere analyzer for monitoring an internal environmental condition of a chamber. Accordingly, to the bake system can remove not only moisture and oxygen that are produced from a target substrate before, after, and during a bake process, but also moisture and oxygen that are produced from an internal space of the chamber, and thereby the bake system can perform a bake process in a highly reliable manner.

While the example embodiments of the inventive concepts have been particularly shown and described, it will be understood by one of ordinary skill in the art that variations and deviations in form and detail may be made therein without departing from the spirit and scope of the inventive concept.

What is claimed is:

1. A bake system, comprising:
a chamber having an internal space;
a stage disposed in the internal space of the chamber and on which a target substrate is disposed;
a gas ejection structure providing a process gas in the chamber;
an exhaust structure including a suction part disposed in the internal space, and an exhaust part connected to the suction part and is disposed outside the chamber;
an atmosphere analyzer monitoring moisture and oxygen in the chamber; and
a gas supplier controlling a flow rate of the process gas, based on information provided from the atmosphere analyzer.

2. The bake system of claim 1, further comprising a guide part disposed between the suction part and the gas ejection structure, wherein the guide part includes one or more openings, and wherein the process gas is exhausted to the exhaust structure through the one or more openings of the guide part.

3. The bake system of claim 2, further comprising a cooling part disposed in the guide part and configured to decrease the temperature of the internal space of the chamber.

4. The bake system of claim 1, wherein the gas ejection structure comprises a first ejection structure and a second ejection structure that is spaced apart from the first ejection structure and configured to produce an airflow in a direction different from that produced by the first ejection structure.

5. The bake system of claim 4, wherein the first ejection structure comprises a first transfer pipe connected to the gas supplier, a first distribution pipe connected to the first transfer pipe, and a first ejection pipe connected to the first distribution pipe, and wherein the first ejection pipe comprises a first ejection hole configured to eject the process gas.

6. The bake system of claim 5, wherein the first ejection pipe comprises a first ejection hole and a second ejection hole configured to eject the process gas in different directions.

7. The bake system of claim 4, wherein the second ejection structure comprises a second transfer pipe connected to the gas supplier, a second distribution pipe connected to the second transfer pipe, and a second ejection pipe connected to the second distribution pipe, and wherein the second ejection pipe comprises a second ejection hole configured to eject the process gas.

8. The bake system of claim 7, wherein the gas ejection structure further comprises a dummy part disposed between the first ejection structure and the second ejection structure and extended along the second ejection pipe, and wherein the process gas ejected through the second ejection pipe is deflected by the dummy part and is exhausted to the exhaust structure.

9. The bake system of claim 1, wherein the stage further comprises a heating part providing heat to the target substrate.

10. The bake system of claim 1, wherein the stage comprises a loading part configured to load the target substrate into the chamber, and a supporting part connected to the loading part, and wherein a height of the loading part is controlled by the supporting part.

11. The bake system of claim 1, wherein the exhaust structure further comprises an exhaust control part connected to the exhaust part and configured to control an exhaust amount of the process gas.

12. The bake system of claim 1, wherein the target substrate comprises a base substrate, a transistor disposed on the base substrate, a first electrode connected to the transistor, a pixel definition layer including an opening exposing at least a portion of the first electrode, and a preliminary organic layer filling the opening.

13. The bake system of claim 1, wherein the chamber further comprises at least one cooling part disposed on an inner wall of the chamber and configured to remove an organic solution in the chamber.

* * * * *